US010223963B2

(12) United States Patent
Gao et al.

(10) Patent No.: US 10,223,963 B2
(45) Date of Patent: Mar. 5, 2019

(54) LIGHT-EMITTING UNIT AND DISPLAY DEVICE

(71) Applicant: Shanghai Tianma Micro-Electronics Co., Ltd., Shanghai (CN)

(72) Inventors: Chaomin Gao, Shanghai (CN); Yuan Ding, Shanghai (CN); Fei Li, Shanghai (CN)

(73) Assignee: SHANGHAI TIANMA MICRO-ELECTRONICS CO., LTD. (CN)

( * ) Notice: Subject to any disclaimer, the term of this patent is extended or adjusted under 35 U.S.C. 154(b) by 0 days.

(21) Appl. No.: 15/865,379

(22) Filed: Jan. 9, 2018

(65) Prior Publication Data

US 2019/0019447 A1    Jan. 17, 2019

(30) Foreign Application Priority Data

Jul. 14, 2017   (CN) .......................... 2017 1 0578812

(51) Int. Cl.
  *G09G 3/32*   (2016.01)
  *H01L 27/15*   (2006.01)
  *H01L 25/075*   (2006.01)
  *H01L 33/08*   (2010.01)

(52) U.S. Cl.
  CPC ........... *G09G 3/32* (2013.01); *H01L 25/0753* (2013.01); *H01L 27/15* (2013.01); *H01L 33/08* (2013.01)

(58) Field of Classification Search
  CPC ....... G09G 3/32; H01L 25/0753; H01L 27/15; H01L 33/08; H01L 2224/01; H01L 2224/02; H01L 2224/0212; H01L 2224/02122; H01L 2224/02123; H01L 2224/02125; H01L 2224/0213; H01L 2224/0214; H01L 2224/02145; H01L 2224/02163; H01L 2224/02165; H01L 2224/0217; H01L 2224/0218; H01L 2224/02185

See application file for complete search history.

(56) References Cited

FOREIGN PATENT DOCUMENTS

| CN | 204067432 U | 12/2014 | |
|---|---|---|---|
| CN | 105870156 A | 8/2016 | |
| EP | 3279722 A1 * | 2/2018 | ......... G02F 1/13458 |

OTHER PUBLICATIONS

Chinese Office Action for corresponding Chinese Application Ser. No. 201710578812.8, dated Jul. 4, 2018, pp. 1-7.

* cited by examiner

*Primary Examiner* — Sonya D. McCall-Shepard
(74) *Attorney, Agent, or Firm* — Tarolli, Sundheim, Covell & Tummino LLP (57) ABSTRACT

The present disclosure provides a light-emitting unit and a display device. The light-emitting includes a micro-LED element and a bonding pad. The micro-LED element includes an element pin, the bonding pad includes a bonding pin, in each welding pair of the element pin and the bonding pin, a length of the element pin is greater than a width of the bonding pin, and a non-zero angle is formed between the extending direction of the element pin and the extending direction of the bonding pin. When the element pin is deviated from the bonding pin in a certain range, the element pin can still be aligned accurately with the bonding pin. Thus, a requirement on the alignment precision between the micro-LED element and the bonding pad is lowered in a certain extent, thereby improving the yield.

20 Claims, 8 Drawing Sheets

LIGHT-EMITTING UNIT AND DISPLAY DEVICE

CROSS-REFERENCE TO RELATED APPLICATIONS

The present application claims the benefit of priority to Chinese Patent Application No. 201710578812.8, filed on Jul. 14, 2017, the content of which is incorporated herein by reference in its entirety.

TECHNICAL FIELD

The present disclosure relates to the field of display technologies and, more particularly, to a light-emitting unit and a display device.

BACKGROUND

Recently, a display device using a light-emitting diode (Light-Emitting Diode, LED) as a display pixel has attracted attention because of its lightweight and thin-thickness. The contrast or color tone of such display device does not change according to the angle of view, thus such display device is not limited by the angle of view, in addition, the response speed of the display device is fast when color changes, so that the display device is used more widely.

A light-emitting unit of the above described display device can include a micro-LED element and a bonding pad. An element pin of the micro-LED element is correspondingly welded to a bonding pin of the bonding pad, so as to facilitate the micro-LED element to be connected with other structures. In the related art, a structure of the bonding pin is same as a structure of the element pin. When assembling the micro-LED element and the bonding pad, the element pin of the micro-LED element is correspondingly placed on the bonding pin of the bonding pad, and then a welding process is performed.

However, since a size of the micro-LED element is relatively small, when assembling the micro-LED element and the bonding pad, requirements on alignment precision of the micro-LED element and the bonding pad is relatively high, and thus a yield is relatively low.

SUMMARY

The present disclosure provides a light-emitting unit and a display device, to lower an alignment precision requirement of the micro-LED element and the bonding pad and to improve product yield.

An aspect of the present disclosure is to provide a light-emitting unit, including a micro-light-emitting-diode (micro-LED) element, including: a packaging body including a pin-placing surface, and an element pin placed on the pin-placing surface, the element pin having a strip-like structure, a length direction of the element pin being an extending direction of the element pin, and a width direction of the element pin being perpendicular to the extending direction of the element pin; and a bonding pad, including: a bonding pin having a strip-like structure, a length direction of the bonding pin being an extending direction of the bonding pin, and a width direction of the bonding pin being perpendicular to the extending direction of the bonding pin; wherein the bonding pin and the element pin are welded together in one-to-one correspondence; and wherein in each welding pair of the element pin and the bonding pin, a length of the element pin is greater than a width of the bonding pin, and an included angle between the extending direction of the element pin and the extending direction of the bonding pin is non-zero.

Another aspect of the present disclosure is to provide a display device, including a display panel, the display panel including a plurality of light-emitting units, wherein each of the plurality of light-emitting units includes: a micro-light-emitting-diode (micro-LED) element, including: a packaging body including a pin-placing surface, and an element pin placed on the pin-placing surface, the element pin having a strip-like structure, a length direction of the element pin being an extending direction of the element pin, and a width direction of the element pin being perpendicular to the extending direction of the element pin; and a bonding pad, including: a bonding pin having a strip-like structure, a length direction of the bonding pin being an extending direction of the bonding pin, and a width direction of the bonding pin being perpendicular to the extending direction of the bonding pin; wherein the bonding pin and the element pin are welded together in one-to-one correspondence; and wherein in each welding pair of the element pin and the bonding pin, a length of the element pin is greater than a width of the bonding pin, and an included angle between the extending direction of the element pin and the extending direction of the bonding pin is non-zero.

Solutions of the present disclosure have advantages as follows:

In the light-emitting unit provided by the present disclosure, the micro-LED element includes an element pin, the bonding pad includes a bonding pin, in each welding pair of the element pin and the bonding pin, a length of the element pin is greater than a width of the bonding pin, and a non-zero included angle is formed between the extending direction of the element pin and the extending direction of the bonding pin. When the element pin is deviated from the bonding pin in a certain range, the element pin can still be aligned accurately with the bonding pin. Thus, a range of an allowed assembling error of the micro-LED element is enlarged, and the micro-LED element can be aligned with the bonding pad more easily. Therefore, using such light-emitting unit, requirements on the alignment precision between the micro-LED element and the bonding pad are lowered in a certain extent; and a welding defect caused by misalignment between the micro-LED element and the bonding pad will not happen easily, thereby improving the yield.

It should be appreciated that the general description of the above and detailed description hereinafter are only exemplary, and the present disclosure cannot be limited thereto.

REFERENCE SIGNS

100—micro-LED element;
110—packaging body;
111—pin-placing surface;
120—element pin;
200—bonding pad;
210—bonding pin;
300—display panel;
310—light-emitting unit;
320—display area;
320a—peripheral area; and
320b—inner area.

Accompanying drawings are incorporated into the specification and constitutes a part of the specification, which illustrate embodiments in conformity with the present disclosure, and are used to together with the specification to explain the principle of the present disclosure.

DESCRIPTION OF EMBODIMENTS

The present disclosure is described in further detail with reference to the accompanying drawings and embodiments.

Figure 1:
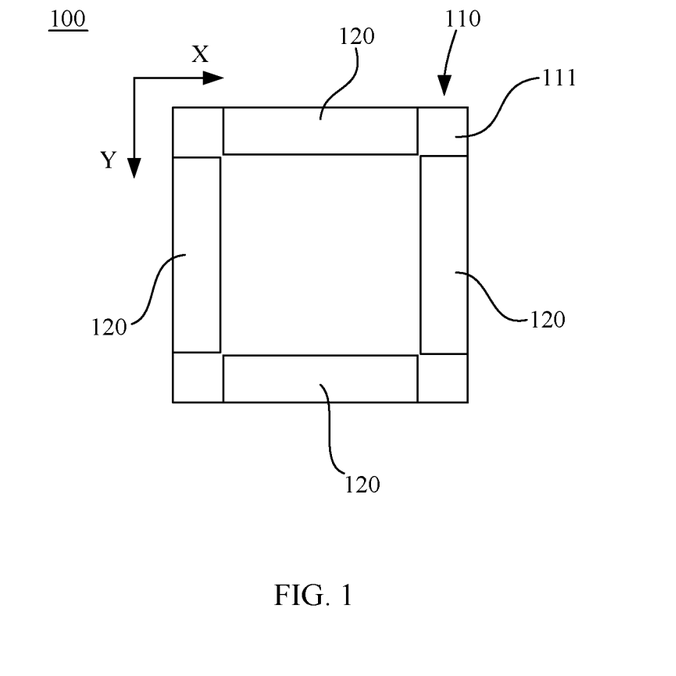
FIG. 1 illustrates a structural schematic view of a micro-LED element of a light-emitting unit according to an embodiment of the present disclosure.
Figure 2:
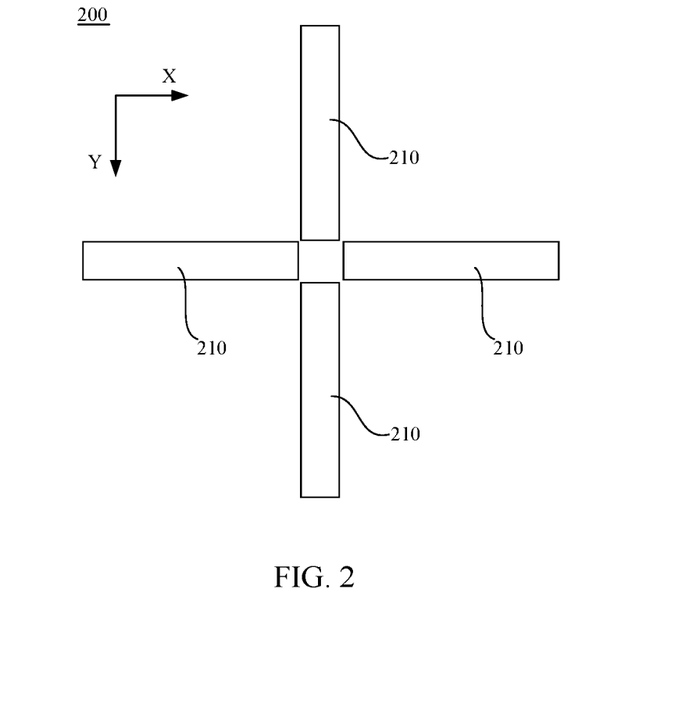
FIG. 2 illustrates a structural schematic view of a bonding pad of a light-emitting unit according to an embodiment of the present disclosure.
Figure 3:
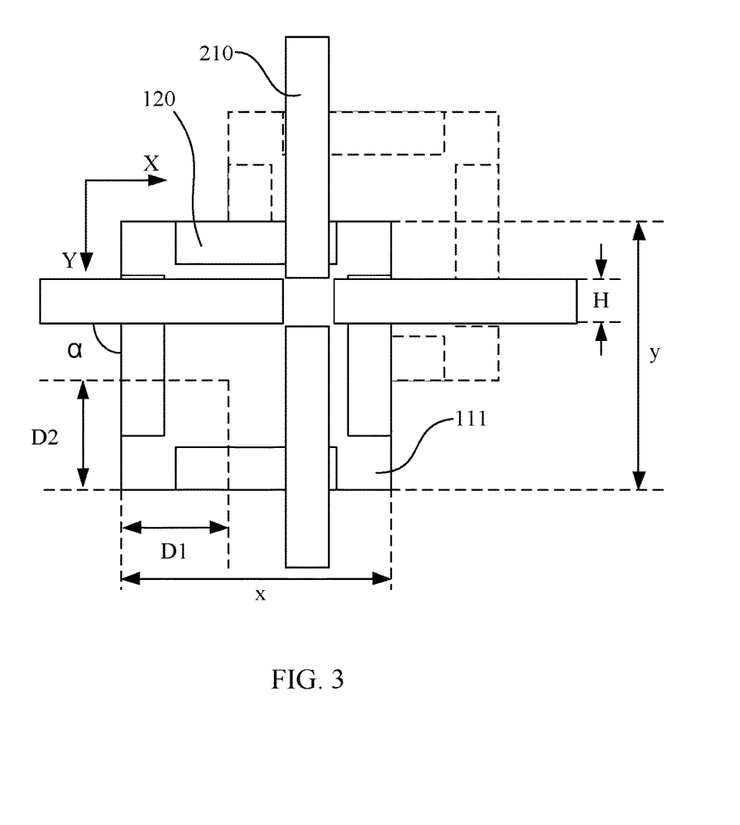
FIG. 3 illustrates a structural schematic view of a light-emitting unit according to an embodiment of the present disclosure.

As shown in FIGS. 1-3, an embodiment of the present disclosure provides a light-emitting unit. The light-emitting unit can be used in a display device, and includes a micro-LED element 100 and a bonding pad 200. The micro-LED element 100 and the bonding pad 200 are welded together to facilitate the micro-LED to be connected to other structures of the display device.

FIG. 1 illustrates a detailed structure of the micro-LED element 100. A size of the micro-LED element 100 is in a range from 5 μm to 100 μm. The micro-LED element 100 includes a packaging body 110 including a pin-placing surface 111 and an element pin 120 placed on the pin-placing surface 111. Various components used for emitting light are packaged in the packaging body 110. The element pin 120 is a strip-like structure. A length direction of the element pin 120 is an extending direction of the element pin 120, and a width direction of the element pin 120 is perpendicular to the extending direction of the element pin 120. As shown in FIG. 1, take the topmost element pin 120 of the pin-placing surface 111 in FIG. 1 as an example, a length direction of the element pin 120 is X direction in FIG. 1 or a direction opposite to X direction, and a width direction of the element pin 120 is Y direction in FIG. 1 or a direction opposite to Y direction. Length direction and width direction of other element pins 120 are similar to the above-described element pin 120, which is not repeated herein.

FIG. 2 illustrates a detailed structure of the bonding pad 200. The bonding pad 200 may include a bonding pin 210. The bonding pin 210 is a strip-like structure. A length direction of the bonding pin 210 is an extending direction of the bonding pin 210, and a width direction of the bonding pin 210 is perpendicular to the extending direction of the bonding pin 210. As shown in FIG. 3, take the topmost bonding pin 210 welded to the element pin 120 of the pin-placing surface 111 in FIG. 3 as an example, a length direction of the bonding pin 210 is X direction in FIG. 2 or a direction opposite to X direction, and a width direction of the bonding pin 210 is Y direction in FIG. 2 or a direction opposite to Y direction. Length direction and width direction of other bonding pins 210 are similar to the above-described bonding pin 210, which is not repeated herein.

As shown in FIG. 3, all the element pins 120 and all the bonding pins 210 are welded together in one-to-one correspondence. In each welding pair of the element pin 120 and the bonding pin 210, a length of the element pin 120 is greater than a width of the bonding pin 210, and a non-zero angle α is formed between the extending direction of the element pin 120 and the extending direction of the bonding pin 210.

When assembling the micro-LED element 100, the micro-LED element 100 should be aligned with the bonding pad 200. Since the length of the element pin 120 is greater than the width of the bonding pin 210, and the non-zero angle α is formed between the extending direction of the element pin 120 and the extending direction of the bonding pin 210, when the micro-LED element 100 is positioned at a position shown in solid line in FIG. 3 relative to the bonding pad 200, the micro-LED element 100 can be accurately aligned with the bonding pad 200. When the micro-LED element 100 deviates in X direction or in Y direction in FIG. 3 relative to the bonding pad 200, the micro-LED element 100 can still be accurately aligned with the bonding pad 200, for example, as shown in FIG. 3, a deviation distance of the micro-LED element 100 relative to the bonding pad 200 is D1 in X direction, a deviation distance of the micro-LED element 100 relative to the bonding pad 200 is D2 in Y direction, and the micro-LED element 100 is positioned at a position shown in dotted line in FIG. 3, in this case, the micro-LED element 100 can still be accurately aligned with the bonding pad 200.

It is known from the above description that, even when the element pin 120 is deviated from the bonding pin 210 in a certain range, the element pin 120 can still be accurately aligned with the bonding pin 210. Thus, a range of an allowed assembling error of the micro-LED element is enlarged, and the micro-LED element 100 can be aligned with the bonding pad 200 more easily. Therefore, using such light-emitting unit, requirements on the alignment precision between the micro-LED element 100 and the bonding pad 200 is lowered in a certain extent; and thus welding defects caused by misalignment between the micro-LED element 100 and the bonding pad 200 will not happen easily, thereby improving the yield. In addition, a contact area between the micro-LED element 100 and the bonding pad 200 is not changed, which means that a contact resistance remain unchanged, so that a brightness uniformity of the micro-LED element is guaranteed.

Figure 4:
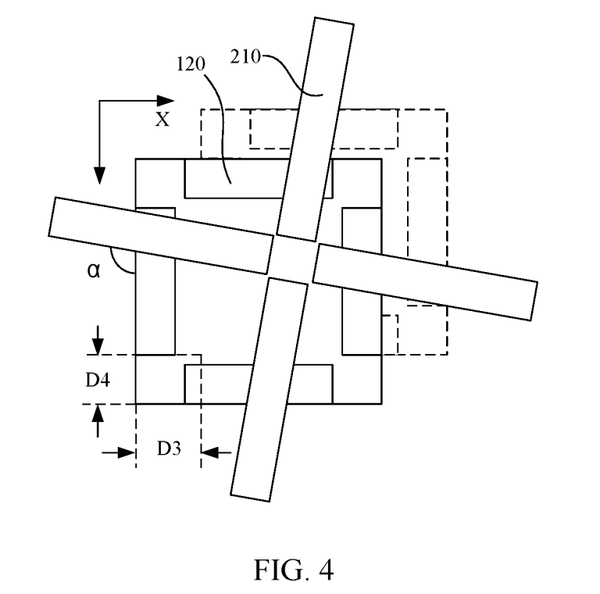
FIG. 4 illustrates a structural schematic view of another light-emitting unit according to an embodiment of the present disclosure.

Furthermore, the angle α formed between the extending direction of the element pin 120 and the extending direction of the bonding pin 210 is optionally greater than 45° and less than 90°, such as a structure as shown in FIG. 4. If an alignment error between the micro-LED element 100 and the bonding pad 200 occurs (as shown in FIG. 4, a deviation distance of the micro-LED element 100 relative to the bonding pad 200 is D3 in X direction, a deviation distance of the micro-LED element 100 relative to the bonding pad 200 is D4 in Y direction), the range of the allowed assembling error of the micro-LED element relative to the bonding pad 200 is still great.

Furthermore, the extending direction of the bonding pin 210 may be perpendicular to the extending direction of the element pin 120 correspondingly welded to the bonding pin 210. That is to say, the angle α formed between the extending direction of the element pin 120 and the extending direction of the bonding pin 210 is equal to 90°. Referring to FIG. 3, take the topmost element pin 120 of the pin-placing surface 111 and the bonding pin 210 welded to the element pin 120 as an example, the bonding pin 210 is perpendicular to the element pin 120. As shown in FIG. 4, in a first solution, that is, the extending direction of the bonding pin 210 is not perpendicular to the extending direction of the element pin 120 welded to the bonding pin 210, an allowed maximum alignment error is a deviation range D3, D4 between the solid portion and the dotted portion. As shown in FIG. 3, in a second solution, that is, the extending direction of the bonding pin 210 is perpendicular to the extending direction of the element pin 120 welded to the bonding pin 210, an allowed maximum alignment error is a deviation range D1, D2 between the solid portion and the dotted portion. When sizes of the pin-placing surface 111, the element pin 120, and the bonding pin 210 in the first solution are the same as those in the second solution, it can be calculated that D3<D1, and D4<D2. That is to say, when the extending direction of the bonding pin 210 is perpendicular to the extending direction of the element pin 120 welded to the bonding pin 210, the range of the allowed alignment error is greater.

Figure 5:
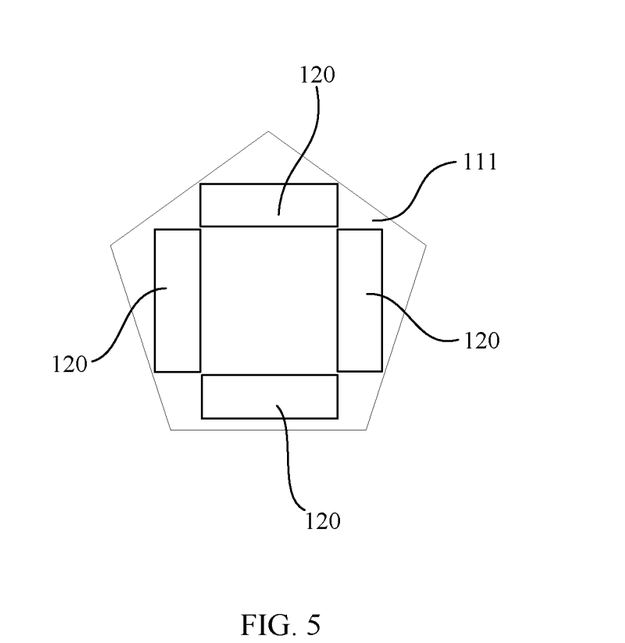
FIG. 5 illustrates a structural schematic view of a micro-LED element of another light-emitting unit according to an embodiment of the present disclosure.

Optionally, the pin-placing surface 111 of the packaging body 110 can be pentagonal as shown in FIG. 5, can be rectangular as shown in FIG. 1, or can be in other structures. According to use requirements of the conventional micro-LED element 100, in the embodiment of the present disclosure, the pin-placing surface 111 is rectangular, which can simplify a manufacturing process of the micro-LED element 100, so that the micro-LED element 100 is applicable to more types of display devices, so as to facilitate the arrangement of the element pin 120.

When the pin-placing surface 111 is rectangular, and the extending direction of the bonding pin 210 is perpendicular to the extending direction of the element pin 120 welded to the bonding pin 210, the bonding pin 210 is parallel to at least one element pin 120 which is not welded to this bonding pin 210. As shown in FIG. 3, take the topmost element pin 120 of the pin-placing surface 111 as an example, the topmost element pin 120 of the pin-placing surface 111 is parallel to a leftmost bonding pin 210 and a rightmost bonding pin 210 located on the pin-placing surface 111. A length of the element pin 120 can be smaller than a length of the bonding pin 210 parallel to the element pin 120, and apparently, the length of the element pin 120 can also be equal to the length of the bonding pin 210 parallel to the element pin 120. When the length of the element pin 120 is equal to the length of the bonding pin 210 parallel to the element pin 120, the element pin 120 can be just sufficiently welded to the bonding pin 210 in the alignment error range without redundant material. Thus, for the element pin 120 and the bonding pin 210 parallel to each other, the length of the element pin 120 is equal to the length of the bonding pin 210, which can control the size of the bonding pad 200 and the manufacturing cost on the premise of the welding requirements are met.

In the light-emitting unit provided by the embodiments of the present disclosure, the light-emitting unit can include a plurality of element pins 120 and a plurality of bonding pins 210, and quantities of them can be determined according to color etc. of the micro-LED element 100. For example, when the micro-LED element 100 is monochromatic, the quantity of the element pin 120 is generally two; and when the micro-LED element 100 is polychromatic, the quantity of the element pin 120 is generally four. In other cases, the quantity of the element pin 120 can be three or other numbers. The present disclosure provides three embodiments as follows. Apparently, quantities and detailed arrangements of the element pin 120 and the bonding pin 210 are not limited to the three embodiments.

First Embodiment

Figure 6:
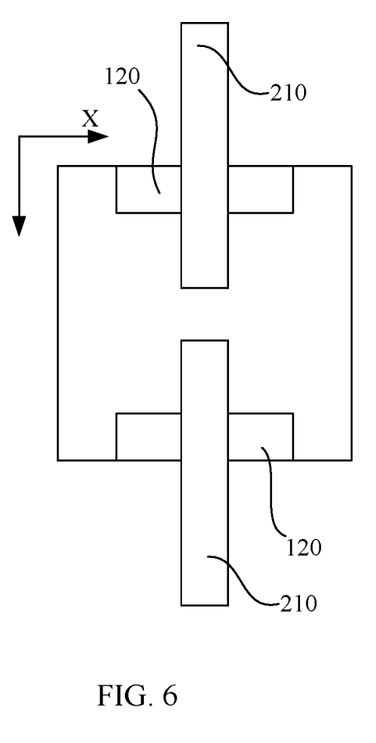
FIG. 6 illustrates a structural schematic view of another light-emitting unit according to an embodiment of the present disclosure.
Figure 7:
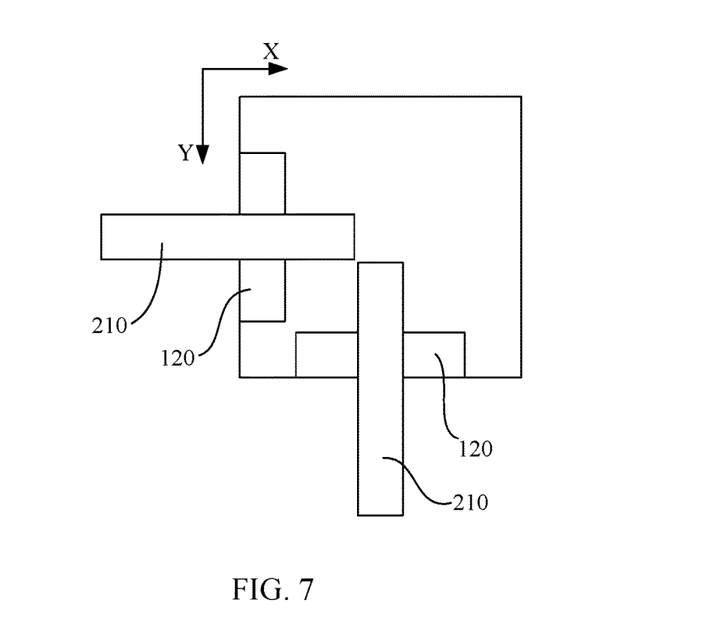
FIG. 7 illustrates a structural schematic view of another light-emitting unit according to an embodiment of the present disclosure.

As shown in FIGS. 6 and 7, quantities of both the element pin 120 and the bonding pin 210 are two. Length directions of the two element pins 120 are parallel to directions of any opposite sides of the pin-placing surface 111, respectively, which is shown in FIG. 6. Or, Length directions of the two element pins 120 are parallel to directions of any two adjacent sides of the pin-placing surface 111, respectively, which is shown in FIG. 7.

Second Embodiment

Figure 8:
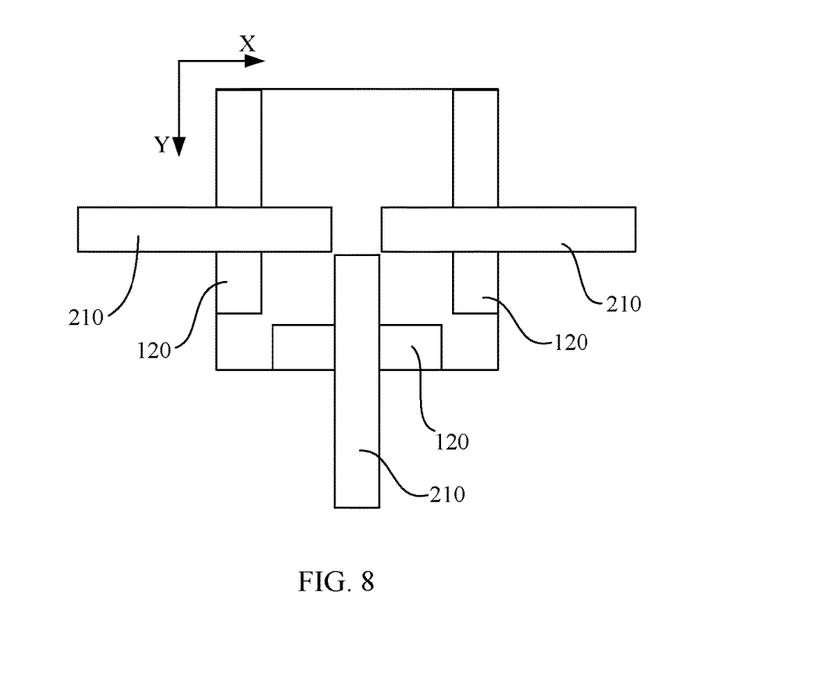
FIG. 8 illustrates a structural schematic view of another light-emitting unit according to an embodiment of the present disclosure.

As shown in FIG. 8, quantities of both the element pin 120 and the bonding pin 210 are three. Specifically, two of the three element pins 120 are opposite to each other, and the other one of the three element pins 120 is placed between the two of the three element pins 120. The three bonding pins 210 are welded to the three element pins 120 in one-to-one correspondence.

Third Embodiment

As shown in FIG. 3, quantities of both the element pin 120 and the bonding pin 210 are four. Length directions of the four element pins 120 are parallel to directions of four sides of the pin-placing surface 111, respectively.

Based on the contact resistance, shapes and sizes of the micro-LED element 100 and the bonding pad 200, in an optional embodiment, as shown in FIG. 3, the width H of the bonding pin 210, a length x and a width y of the pin-placing surface 111, and the contact area W between the bonding pin 210 and the element pin 120 meet a relation as follows:

$$H=(Wx/y)\textasciicircum 0.5$$

When the width H of the bonding pin 210, the length x and the width y of the pin-placing surface 111, and the contact area W between the bonding pin 210 and the element pin 120 meet the relation as above described, the range of the allowed alignment error of the micro-LED element relative to the bonding pad 200 is greatest.

Furthermore, the contact area W between the bonding pin 210 and the element pin 120 is greater than or equal to an area threshold, and the area threshold is determined by factors including the contact resistance between the micro-LED element 100 and the bonding pad 200. That is to say, a value of the contact area W between the bonding pin 210 and the element pin 120 is affected by the contact resistance between the micro-LED element 100 and the bonding pad 200, so that the contact area W between the bonding pin 210 and the element pin 120 can meet the requirements on the contact resistance between the micro-LED element 100 and the bonding pad 200, and then a luminous performance of the whole light-emitting unit can be guaranteed.

Since the quantities of the element pins 120 and the bonding pins 210 are more than one, thereby forming a plurality of pairs of the element pin 120 and the bonding pin 210 welded together. When designing structures of the element pins 120 and the bonding pins 210, the contact areas W of different pairs of the element pin 120 and the bonding pin 210 welded together are the same, or the contact areas W of at least two pairs of the element pin 120 and the bonding pin 210 welded together are different from each other. For example, if a current in one pair of the element pin 120 and the bonding pin 210 welded together is greater, the contact area of this pair can be greater accordingly, so as to decrease the contact resistance between the element pin 120 and the bonding pin 210 welded together. Structures of the element pin 120 and the bonding pin 210 welded together can be designed according to other actual requirements.

Figure 9:
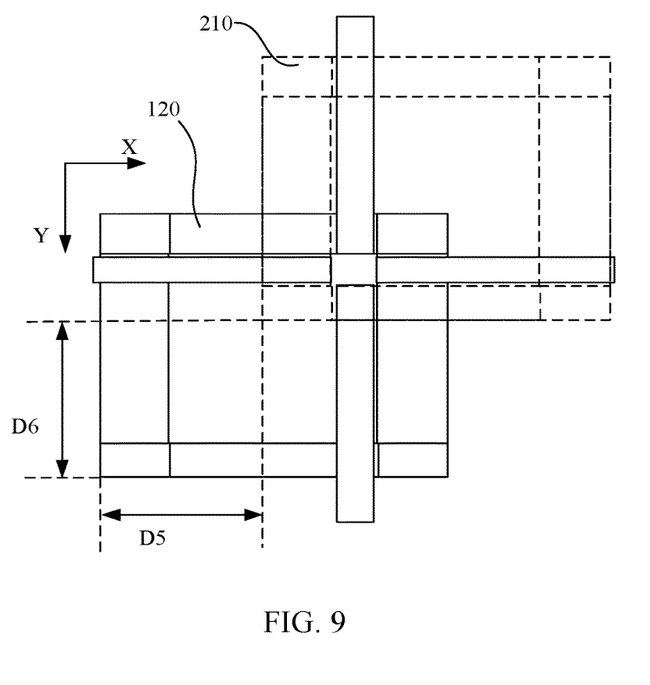
FIG. 9 illustrates a structural schematic view of another light-emitting unit according to an embodiment of the present disclosure.

It is known from the above description that, the luminous performance of the light-emitting unit is affected greatly by the contact area W between the element pin 120 and the bonding pin 210. If the contact area W between the element pin 120 and the bonding pin 210 is determined, by decreasing the width of the bonding pin 210 and increasing the width of the element pin 120, the range of the alignment error of the bonding pin 210 relative to the element pin 120 in a single direction can be increased. Therefore, in any pair of the element pin 120 and the bonding pin 210 welded together, the width of the element pin 120 is greater than the width of the bonding pin 210. As shown in FIG. 9, if the length of the micro-LED element in X direction is greater than the width thereof in Y direction, it is obtained after comparison referring to the figures or by a simple calculation that, a range of the alignment error D5 of the bonding pin 210 relative to the element pin 120 in X direction can be increased properly, while a range of the alignment error D6 in Y direction can be decreased properly. Thus, the present embodiment is applicable to a situation that the allowed alignment error in Y direction is smaller than the allowed alignment error in X direction.

Figure 10:
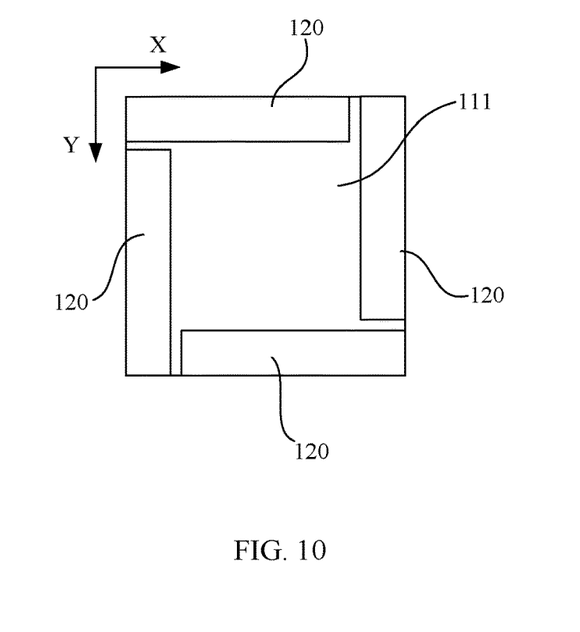
FIG. 10 illustrates a structural schematic view of a micro-LED element of another light-emitting unit according to an embodiment of the present disclosure.

As shown in FIG. 10, in any two adjacent element pins 120, one of the two adjacent element pins 120 can extend to a side of the other one of the two adjacent element pins 120, in this case, in extending directions of the two adjacent element pins 120, projections of the two adjacent element pins 120 overlap in part. In another embodiment, as shown in FIG. 1, in any two adjacent element pins 120, projections of the element pins 120 do not overlap in the extending direction of any element pin 120. Take the topmost and the leftmost element pin 120 on the pin-placing surface 111 as an example, in an extending direction of the topmost element pin 120, projections of the two element pins 120 on the pin-placing surface 111 do not overlap; while in in an extending direction of the leftmost element pin 120, projections of the two element pins 120 on the pin-placing surface 111 do not overlap either. An advantage of such an arrangement is illustrated as follows. In the range of the alignment error of the bonding pin 210 relative to the element pin 120, if projections of two adjacent element pins 120 overlap partially, a portion of one element pin 120 corresponding to an overlapping position is blocked by a portion of the other element pin 120, and then cannot be welded to the bonding pin 210. Thus, in a non-overlapping manner, there is no redundant structure on the element pin 120, which makes structure utilization rate of the light-emitting unit higher and makes cost lower.

When the quantity of the element pins 120 can be more than one, each element pin 120 is placed along a direction of an outer contour of the pin-placing surface 111. For example, as shown in FIG. 5, when the outer contour of the pin-placing surface 111 is pentagonal, each element pin 120 is placed along a direction of an outer contour of pentagon. As shown in FIG. 1, when the outer contour of the pin-placing surface 111 is tetragonal, each element pin 120 is placed along a direction of an outer contour of tetragon. When the outer contour of the pin-placing surface 111 is irregular, each element pin 120 is placed along a direction of the irregular outer contour. In brief, an arrangement direction of each element pin 120 is generally along an extending direction of an outer contour of the pin-placing surface 111.

Figure 11:
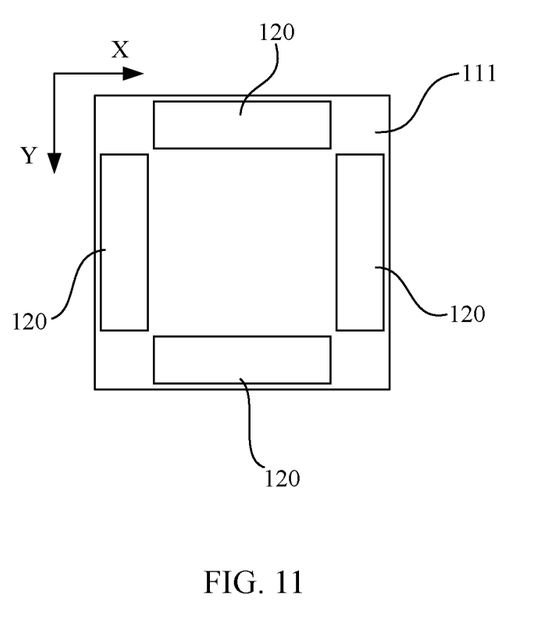
FIG. 11 illustrates a structural schematic view of a micro-LED element of another light-emitting unit according to an embodiment of the present disclosure.

The reason each element pin 120 is placed along the direction of an outer contour of the pin-placing surface 111 is to increase the length of each element pin 120 as much as possible in a limited space and then to increase the range of the allowed alignment error of the micro-LED element 100 relative to the bonding pad 200. In this regard, a structure as shown in FIG. 11 can be used, that is, each element pin 120 is relatively adjacent to the outer contour of the pin-placing surface 111, but does not overlap with the outer contour. Furthermore, in another optional embodiment, at least one portion of a contour of at least one element pin 120 overlaps with at least one portion of an outer contour of the pin-placing surface 111, as shown in FIG. 1. In that embodiment, a closeness extent of each element pin 120 relative to the outer contour of the pin-placing surface 111 almost reaches greatest extent, so that the length of the element pin 120 can be increased to the utmost, and then the range of the allowed alignment error of the micro-LED element 100 relative to the bonding pad 200 is increased.

Figure 12:
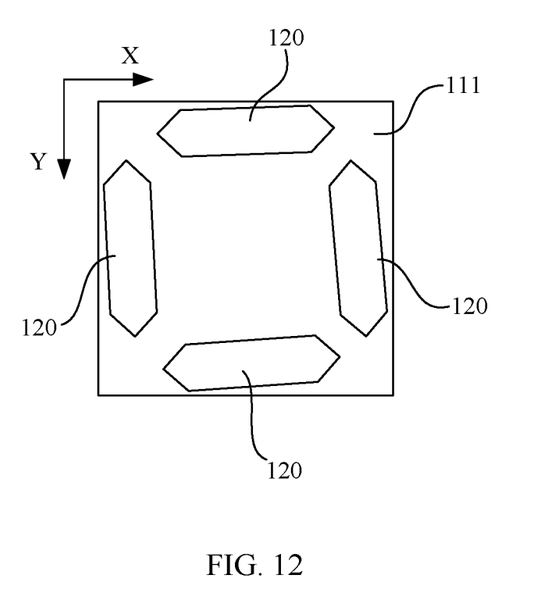
FIG. 12 illustrates a structural schematic view of a micro-LED element of another light-emitting unit according to an embodiment of the present disclosure.

As shown in FIG. 12, a length direction of the element pin 120 can incline relative to an extending direction of a portion of the outer contour of the pin-placing surface 111 corresponding to the present element pin 120. Apparently, a structure as shown in FIG. 1 can also be used, that is, the length direction of the element pin 120 is parallel to the extending direction of a portion of the outer contour of the pin-placing surface 111 corresponding to the present element pin 120. Specifically, as shown in FIG. 1, take the topmost element pin 120 on the pin-placing surface 111 as an example, the length direction of the element pin 120 is parallel to the extending direction of a portion of the outer contour of the pin-placing surface 111 closest to the present element pin 120. When the latter arrangement manner is used, the element pin 120 as a whole can be close to the outer contour of the pin-placing surface 111 in a greater extent, so that the length of the element pin 120 is greater, which facilitates increasing the range of the allowed alignment error of the micro-LED element 100 relative to the bonding pad 200.

Each bonding pin 210 can be in a structure as shown in FIG. 2, that is, arrangement of each bonding pin 210 is regular. Specifically, first ends (one end) of the bonding pins 210 gather together, while second ends (the other end) of the bonding pins 210 scatter from each other. Thus, the bonding pins 210 can be placed compactly, and the range of the allowed alignment error is increased to guarantee each bonding pin 210 and each element pin 120 to be welded together in one-to-one correspondence.

In the embodiments of the present disclosure, the alignment error exists between the bonding pin 210 and the element pin 120, so that in different light-emitting units, there are a plurality of welding positions between the bonding pin 210 and the element pin 120. However, in one singular light-emitting unit, it cannot be determined that at which position the bonding pin 210 is welded to the element pin 120, therefore, for guaranteeing a stable or even constant contact area between the bonding pin 210 and the element pin 120 at any welding position, widths of each point of the element pin 120 distributed along its extending direction are the same, and widths of each point of the bonding pin 210 distributed along its extending direction are the same. That is, in the extending direction of the element pin 120, the width of the element pin 120 keep constant, and in the extending direction of the bonding pin 210, the width of the bonding pin 210 keep constant either. In this case, even a welding position between the bonding pin 210 and the element pin 120 changes, the contact area between the bonding pin 210 and the element pin 120 keep unchanged substantially, to make the contact resistance between them keep stable. Specifically, the rectangular structure as shown in FIG. 1 can be used, or other structures meeting the above requirements can also be used.

Figure 13:
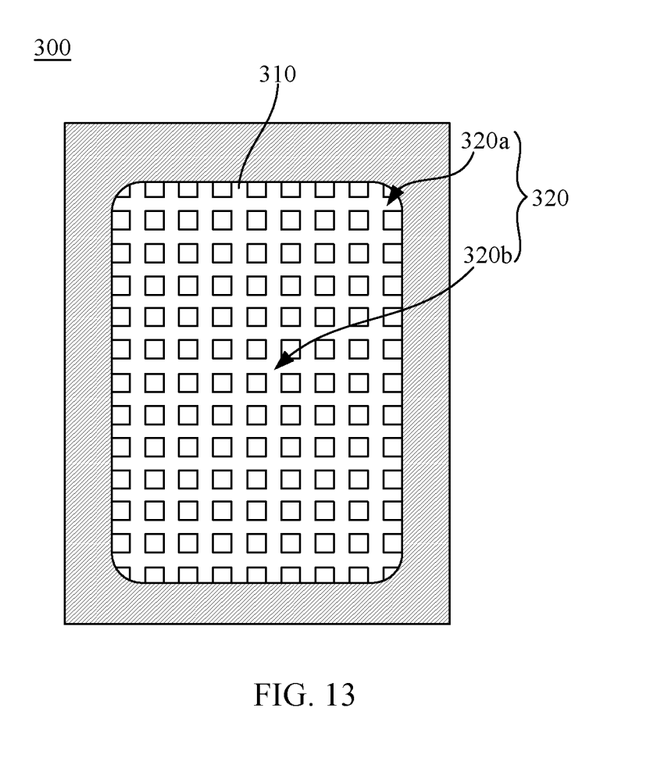
FIG. 13 illustrates a structural schematic view of a display panel of a display device according to an embodiment of the present disclosure.

As shown in FIG. 13, based on the light-emitting units in the above-described embodiments, embodiments of the present disclosure further provide a display device. The display device can include a display panel 300. The display panel 300 includes a plurality of light-emitting units 310. The light-emitting unit 310 can be any one of the light-emitting units in the above-described embodiments.

Generally, quantity of the light-emitting unit 310 is more than one, and the element pin 120 and the bonding pin 210 of each light-emitting unit 310 have a contact area. In at least two light-emitting units 310, the contact area between the element pin 120 and the bonding pin 210 are different from each other. Such a structure is applicable a situation that the light-emitting units 310 at different positions of the display panel are required to emit light with different brightness. For example, if a brightness of blue light is low relatively, for making the blue micro-LED element 100 brighter, a current in the blue micro-LED element 100 is increased, so that the contact area between the element pin 120 and the bonding pin 210 in the blue micro-LED element 100 is greater than contact areas in a red micro-LED element 100, in a green micro-LED element 100, so that greater current is provided in the blue micro-LED element 100.

Generally, the display panel 300 includes a display area 320. The display area 320 includes a peripheral area 320a and an inner area 320b except the peripheral area 320. In one optional embodiment, in the peripheral area 320a, the contact area of the light-emitting unit 310 refers to a first area, in the inner area 320b, the contact area of the light-emitting unit 310 refers to a second area, and the first area is smaller than the second area. That is, brightness of the light-emitting units 310 in the peripheral area 320a is smaller than brightness of the light-emitting units 310 in the inner area 320b, so that the peripheral area 320a is darker than the inner area 320b. Since blur and zigzag may easily occur in the peripheral area 320a, when the peripheral area 320a is darker than the inner area 320b, a blur and zigzag edge phenomenon can be weaken to improve user experience.

The above description only shows some preferred embodiments of the present disclosure, but is not used to limit the present disclosure. For those skilled in the art, the present disclosure can be various modifications and variations. All any modification, equivalent substitution, and improvements within the spirit and principle of the present disclosure should be included within the protection scope of the present disclosure.

What is claimed is:

1. A light-emitting unit, comprising:
  a micro-light-emitting-diode (micro-LED) element, comprising:
    a packaging body comprising a pin-placing surface, and
    an element pin placed on the pin-placing surface, the element pin having a strip-like structure, a length direction of the element pin being an extending direction of the element pin, and a width direction of the element pin being perpendicular to the extending direction of the element pin; and
  a bonding pad, comprising:
    a bonding pin having a strip-like structure, a length direction of the bonding pin being an extending direction of the bonding pin, and a width direction of the bonding pin being perpendicular to the extending direction of the bonding pin;
  wherein the bonding pin and the element pin are welded together in one-to-one correspondence; and
  wherein in each welding pair of the element pin and the bonding pin, a length of the element pin is greater than a width of the bonding pin, and an included angle between the extending direction of the element pin and the extending direction of the bonding pin is non-zero.

2. The light-emitting unit according to claim 1, wherein the included angle is greater than 45° and less than or equal to 90°.

3. The light-emitting unit according to claim 1, wherein the light-emitting unit comprises a plurality of element pins, and the element pins are distributed along a direction of an outer contour of the pin-placing surface; and at least one portion of a contour of at least one of the element pins partially overlaps with at least one portion of the outer contour of the pin-placing surface.

4. The light-emitting unit according to claim 3, wherein a length direction of each of the element pins is parallel to an extending direction of a portion of the outer contour of the pin-placing surface corresponding to the element pin.

5. The light-emitting unit according to claim 3, wherein first ends of the bonding pins gather together, and second ends of the bonding pins scatter from each other.

6. The light-emitting unit according to claim 3, wherein the element pin has a uniform width along the extending direction of the element pin, and the bonding pin has a uniform width along the extending direction of the bonding pin.

7. The light-emitting unit according to claim 1, wherein the pin-placing surface is rectangular, and the extending direction of the bonding pin is perpendicular to the extending direction of the element pin welded to the bonding pin.

8. The light-emitting unit according to claim 7, wherein for the element pin and the bonding pin parallel to each other, a length of the bonding pin is equal to the length of the element pin.

9. The light-emitting unit according to claim 7, wherein a quantity of the element pin is two, a quantity of the bonding pin is two, and length directions of the two element pins are parallel to directions of any two opposite sides of the pin-placing surface, respectively.

10. The light-emitting unit according to claim 7, wherein a quantity of the element pin is two, a quantity of the bonding pin is two, and length directions of the two element pins are parallel to directions of any two adjacent sides of the pin-placing surface, respectively.

11. The light-emitting unit according to claim 7, wherein a quantity of the element pin is four, and length directions of the four element pins are parallel to directions of four sides of the pin-placing surface, respectively.

12. The light-emitting unit according to claim 7, wherein a width H of the bonding pin, a length x and a width y of the pin-placing surface, and a contact area W between the bonding pin and the element pin meet a relation of $$H=(Wx/y)^{0.5}.$$

13. The light-emitting unit according to claim 12, wherein the contact area W is greater than or equal to an area threshold, and the area threshold is determined by factors comprising a contact resistance between the micro-LED element and the bonding pad.

14. The light-emitting unit according to claim 12, wherein the contact areas W of at least two pairs of the element pin and the bonding pin welded together are different from each other.

15. The light-emitting unit according to claim 12, wherein in any pair of the element pin and the bonding pin welded together, a width of the element pin is greater than the width of the bonding pin.

16. The light-emitting unit according to claim 7, wherein in any two adjacent element pins, projections of the element pins are non-overlapping in the extending direction of any one of the two adjacent element pins.

17. The light-emitting unit according to claim 7, wherein the element pin has a uniform width along the extending direction of the element pin, and the bonding pin has a uniform width along the extending direction of the bonding pin.

18. A display device, comprising a display panel, the display panel comprising a plurality of light-emitting units, wherein each of the plurality of light-emitting units comprises:
  a micro-light-emitting-diode (micro-LED) element, comprising:
    a packaging body comprising a pin-placing surface, and
    an element pin placed on the pin-placing surface, the element pin having a strip-like structure, a length direction of the element pin being an extending direction of the element pin, and a width direction of the element pin being perpendicular to the extending direction of the element pin; and
  a bonding pad, comprising:
    a bonding pin having a strip-like structure, a length direction of the bonding pin being an extending direction of the bonding pin, and a width direction of the bonding pin being perpendicular to the extending direction of the bonding pin;
  wherein the bonding pin and the element pin are welded together in one-to-one correspondence; and
  wherein in each welding pair of the element pin and the bonding pin, a length of the element pin is greater than a width of the bonding pin, and an included angle between the extending direction of the element pin and the extending direction of the bonding pin is non-zero.

19. The display device according to claim 18, wherein the element pin and the bonding pin of each of the plurality of light-emitting units have a contact area, and the contact areas of at least two light-emitting units of the plurality of light-emitting units are different from each other.

20. The display device according to claim 19, wherein the display panel comprises a display area, and the display area comprises a peripheral area and an inner area except the peripheral area; the contact area of the light-emitting unit in the peripheral area refers to a first area, the contact area of the light-emitting unit in the inner area refers to a second area, and the first area is smaller than the second area.

* * * * *